United States Patent [19]

Riley

[11] Patent Number: 5,079,734
[45] Date of Patent: Jan. 7, 1992

[54] DIGITAL DECIMATION FILTER
[75] Inventor: Callie A. Riley, Palm Bay, Fla.
[73] Assignee: Harris Corporation, Melbourne, Fla.
[21] Appl. No.: 516,310
[22] Filed: Apr. 30, 1990
[51] Int. Cl.[5] ............................................. G06F 15/31
[52] U.S. Cl. ................................................ 364/724.10
[58] Field of Search ...................... 364/724.01, 724.10, 364/724.16

[56] References Cited
U.S. PATENT DOCUMENTS
4,872,129 10/1989 Pfeifer et al. .................... 364/724.10
4,961,160 10/1990 Sato et al. ........................ 364/724.01

OTHER PUBLICATIONS
R. E. Crochiere et al., "Optimum FIR Digital Filter Implementations for Decimation, Interpolation, and Narrow-Band Filtering", IEEE Trans. on Acoustics, Speed, and Signal Processing, vol. ASSP-23, No. 5, Oct. 1975, pp. 444-456.
"An Economical Class of Digital Filters for Decimation and Interpretation", -IEEE Transactions on Acoustics, Speech, & Signal Processing, vol. ASSP-29, No. 2, Apr. 1, 1981, pp. 155-162.

Primary Examiner—Gary V. Harkcom
Assistant Examiner—Long T. Nguyen
Attorney, Agent, or Firm—Evenson, Wands, Edwards, Lenahan & McKeown

[57] ABSTRACT

A narrow band digital decimation filter that can be implemented on a single integrated circuit has a high order decimation filter that receives input digital data at P sampling rate and produces output digital data at Q sampling rate, where P>Q. The high order decimation filter can be a Hogenauer filter. A finite impulse response (FIR) filter, containing only a single multiplier and only a single accumulator, receives the output from the high order decimation filter at the now lowered sampling rate, and cleans up the frequency response of the high order decimation filter to provide narrow band filtering.

14 Claims, 5 Drawing Sheets

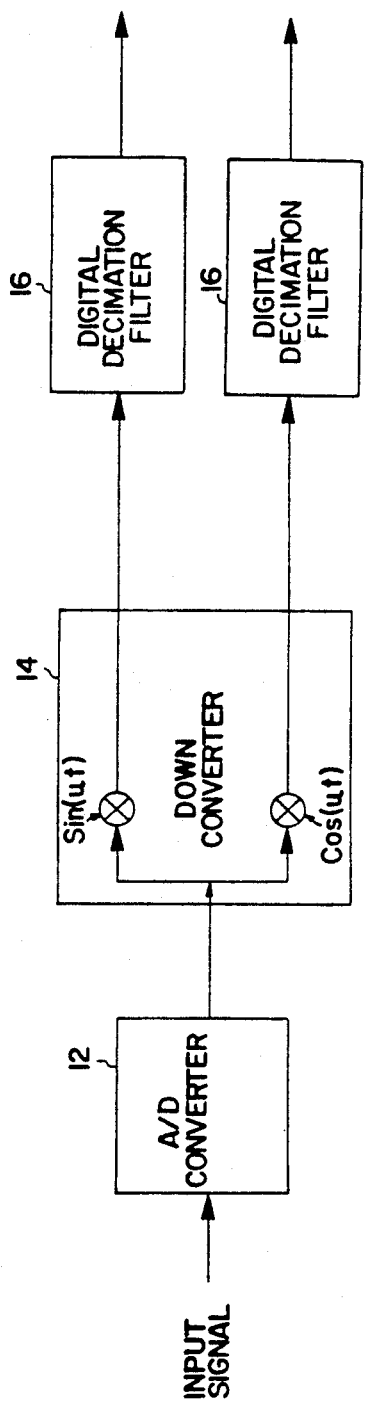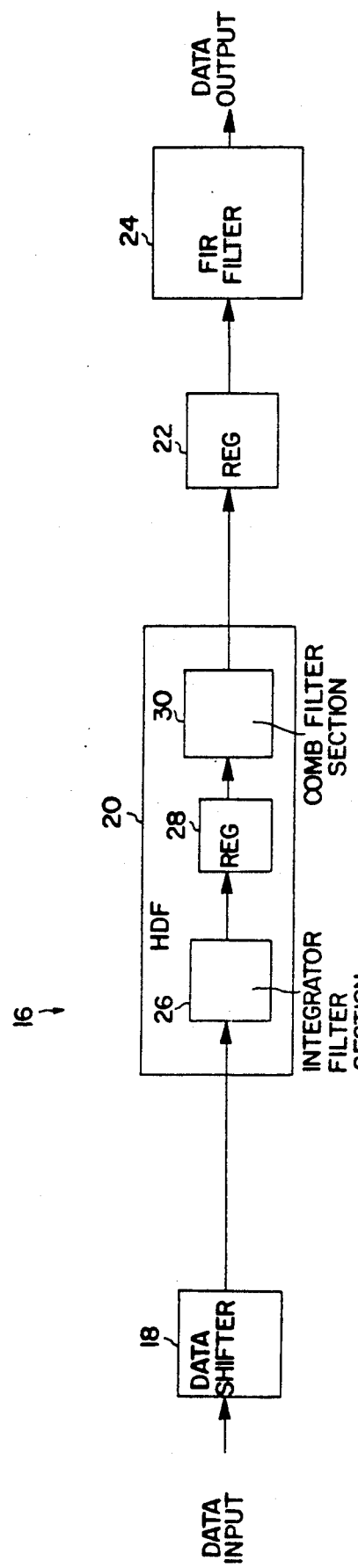

DIGITAL DECIMATION FILTER

FIELD OF THE INVENTION

The present invention relates to narrow band filtering for communications, instrumentation and, more specifically, to a highly integrated device that provides high order decimation.

BACKGROUND OF THE INVENTION

In certain signal processing applications, it is necessary to sample data at a high rate. This is common, for instance, for isolating signals contained within a wide band. This wide band signal will often contain narrow band interferences which must be filtered out. However, because of the high sampling rate, a narrow band filter would ordinarily require an extraordinary amount of hardware. One way to reduce the amount of hardware is by reducing the sampling rate. This can be accomplished through a digital linear phase finite impulse response (FIR) filter that performs "decimation", which is a sampling rate decrease.

One type of decimation filter that has been used is the so-called Hogenauer filter, described in "*An Economical Class of Digital Filters for Decimation and Interpolation*", Eugene B. Hogenauer, IEEE Transactions on Acoustics, Speech and Signal Processing, Vol. ASSP-29, No. 2, April 1981, Pages 155-162. The Hogenauer filter comprises a number of cascaded integrator stages operating at a high sampling rate and a number of comb stages operating at a low sampling rate. The Hogenauer filter can bring the amount of pass band filtering or imaging error within prescribed bounds according to the number of stages in the filter. The advantage of the Hogenauer filter is that these filters require no multipliers and use limited storage and thereby lead to more economical hardware implementations. The Hogenauer filter is economical since no multipliers are required, no storage is required for filter coefficients, intermediate storage is reduced by integrating at the high sampling rate and comb filtering at the low sampling rate, compared to the equivalent implementation using cascaded FIR filters. Furthermore, the structure of the Hogenauer filters is very regular since it comprises two basic building blocks (the integrator section and the comb section). There is little external control or complicated local timing that is required. The same filter can be used for a wide range of rate change factors with the addition of a scaling circuit and a minimal changes to the filter timing.

However, a serious disadvantage of a Hogenauer filter is that the width of the pass band and the frequency characteristics outside the pass band are severely limited. In other words, a Hogenauer filter will provide only a coarse filtering of a signal.

There is a need for a digital decimation filter which filters narrow band signals that are contained in a wide band while still providing a clean frequency response and a fine filtering.

SUMMARY OF THE INVENTION

This and other needs are met by the present invention which provides a digital decimation filter having an input and an output, and an FIR filter coupled to the high order decimation filter. The high order decimation filter receives input digital data at P sampling rate at its input. This input digital data is decimated, and decimated output digital data is produced at Q sampling rate at the output of the high order decimation filter, where P>Q. The input of the FIR filter receives this decimated output digital data and performs final shaping of the output digital data to produce narrow band filtered digital data at the output of the FIR filter.

In an embodiment of the invention, only adders and delay elements are used in the high order decimation filter, and only a single multiplier/accumulator is used in the FIR filter. The digital decimation filter can then be implemented on a single integrated circuit, which provides a large savings of hardware in comparison to implementation of high order decimation and filtering by a standard FIR filter.

Other advantages and novel features of the present invention will become apparent from the following detailed description of the invention when considered in conjunction with the accompanying drawings.

BRIEF DESCRIPTION OF THE DRAWINGS

FIG. 1 shows a digital channelizer which uses the filter of the present invention.

FIG. 2 is a block diagram of a digital decimation filter constructed in accordance with an embodiment of the present invention.

DETAILED DESCRIPTION OF THE DRAWINGS

Figure 3:
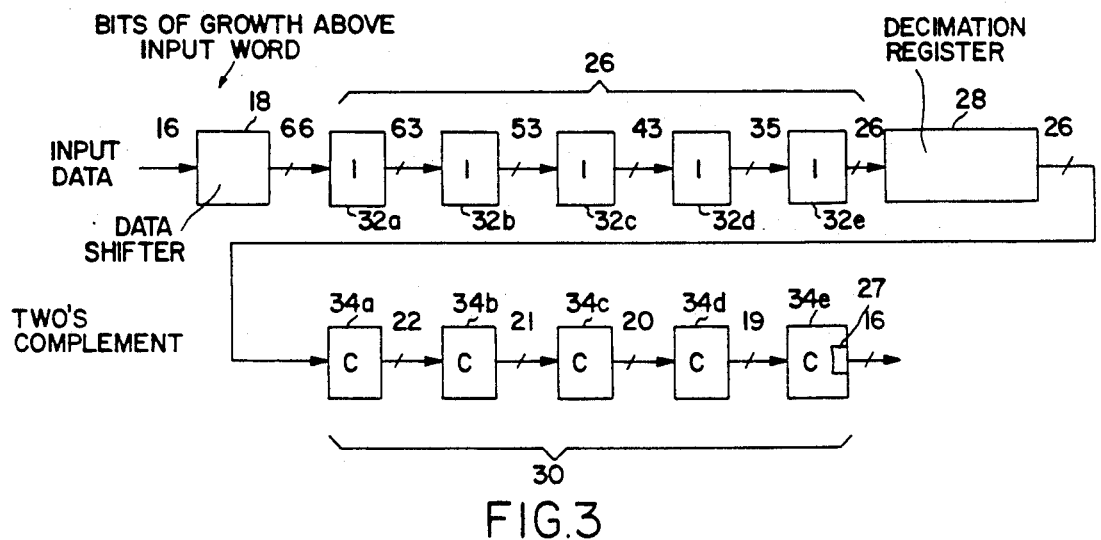
FIG. 3 is a block diagram of a high order decimation filter used in he embodiment of FIG. 2.

A digital channelizer is shown in FIG. 1 that receives an analog input signal into an A/D converter 12 which then converts this signal into a sampled input digital signal. This sampled input digital signal is provided to a down converter 14, which down converts the signal to baseband, generating real and imaginary components. A digital decimation filter 16 is coupled to each one of the output of the down converter 14 and forms decimation on either the real or the imaginary components. The digital decimation filter 16 does this by low pass filtering and reduction of the sampling rate of the signals. The digital decimation filter 16 is shown in more detail in the block diagram of FIG. 2.

The digital decimation filter 16 includes a data shifter 18 that receives the input digital data at a high sampling rate (e.g., 25 MHz). The data shifter 18 is coupled to a high order decimation filter (HDF) 20 that performs decimation to implement a low pass filter in order to reduce the sampling rate of the signal by large values. A register 22 receives the output of the HDF 20 and provides the signal with a reduced sampling rate to an FIR filter 24. Further decimation can be performed by the FIR filter 24, which also cleans up the frequency response. The output of the FIR filter 24 is the data output of the digital decimation filter 16.

As will be explained in more detail with respect to FIG. 3, the HDF 20 contains a cascaded integrator stage section 26, a register 28 coupled to the output of the integrator section 26, and a comb filter 30 coupled to the output of the register 28. The high order decimation filter 20 can be a Hogenauer filter, such as the filters described in the article mentioned earlier in the application.

The digital decimation filter 16 receives sixteen bit two's complement data as input. The input digital data is then processed by the data shifter 18 to produce a 66-bit output word. The data shifter 18 is configured by control signals stored in a register, not shown. Although not shown in FIG. 2, control signals stored in a register are also provided to the HDF 20 and the FIR filter 24 to control the operation of these filters, and to vary the operating parameters of these filters.

In the embodiment of the HDF 20 shown in FIG. 2, there is a maximum decimation factor R of 1,024, although other configurations of the HDF 20 could be provided having different maximum decimation factors. When smaller amounts of decimation are required, the data shifter 18 is configured to shift the 16-bit input digital data such that the correct amount of "growth" bits are above the input word within the 66-bit output bits of the data shifter 18.

The output of the data shifter 18 is provided as an input to the HDF 20. The HDF 20 is controlled by two parameters: the number of cascaded integrator-comb stage pairs and the amount of decimation. The decimation factor, as well as the number of stages, can be programmed by the user of the digital decimation filter 16 by storage into a set of four control registers (not shown). The HDF 20 operates to reduce the input sampling rate by the decimation factor, which can range from 10 to 1,024 in the embodiment of FIG. 2. The aliasing components in the pass band of the HDF 20 depends on the number of integrator-comb pairs which ranges from 1–5 and the amount of decimation. The bandwidth of the signal relative to the filter output sampling rate is determined by the decimation factor.

Figure 4:
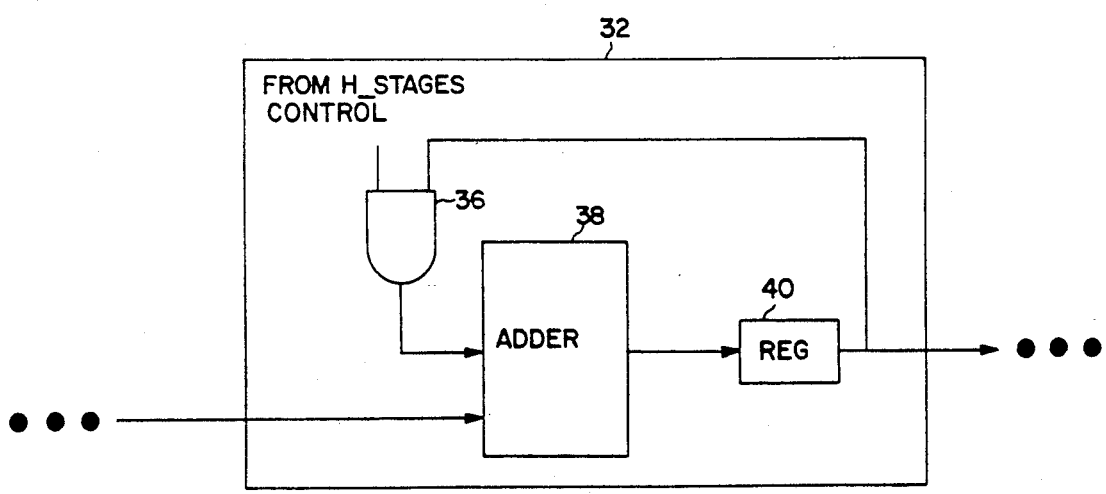
FIG. 4 illustrates an integrator stage of the high order decimation filter of FIG. 3.

FIG. 3 is a more detailed block diagram of the HDF 20. The integrator stage section 26 includes five identical integrator stages 32a–e. The first integrator stage 32a receives the 66-bit input word from the data shifter 18. An example of an integrator stage 32 is shown in FIG. 4 and comprises a two's complement adder 38 with a register 40 in a feedback path to form an accumulator. An AND gate 36, which receives as one of its inputs a control signal, controls the particular integrator stage 32.

The bit width into each integrator stage 32a–e is calculated from the total amount of growth expected across all five integrator stages 32a–e, and the amount of truncation allowed at the output of each integrator stage 32a–e. Thus, as seen in FIG. 3, the 66-bit input word is reduced to a 26-bit output word at the output of the last integrator stage 32e. This 26-bit output word is provided as an input to the decimation register 28.

The decimation register 28 performs a rate change switch between the two filter sections 26 and 30. To perform the decimation, the decimation register 28 sub-samples the output of the last integrator stage 32e, and thereby reduces the sampling rate by the decimation factor R.

Figure 5:
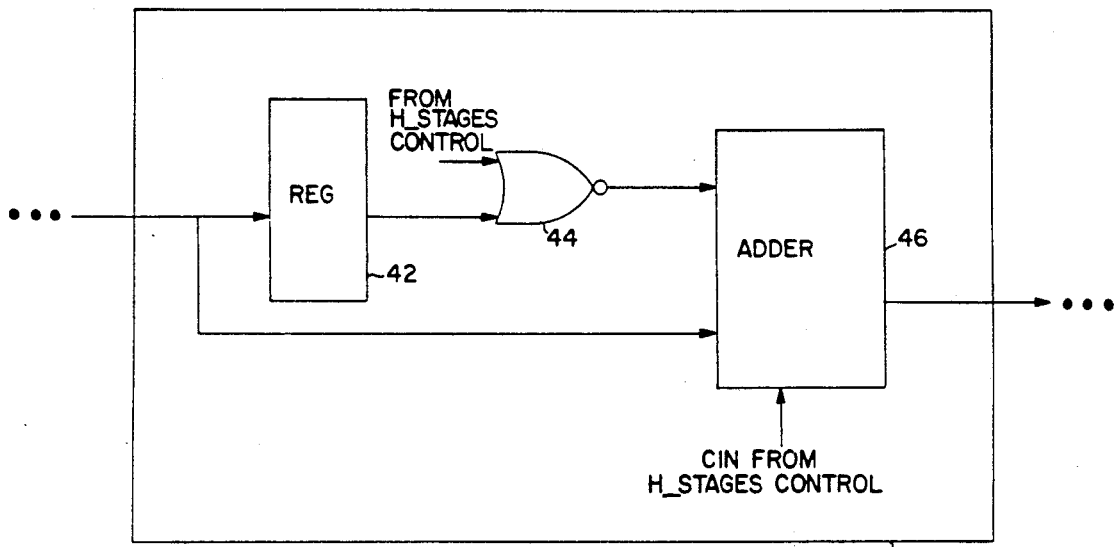
FIG. 5 illustrates a comb filter stage of the high order decimation filter of FIG. 3.
Figure 6:
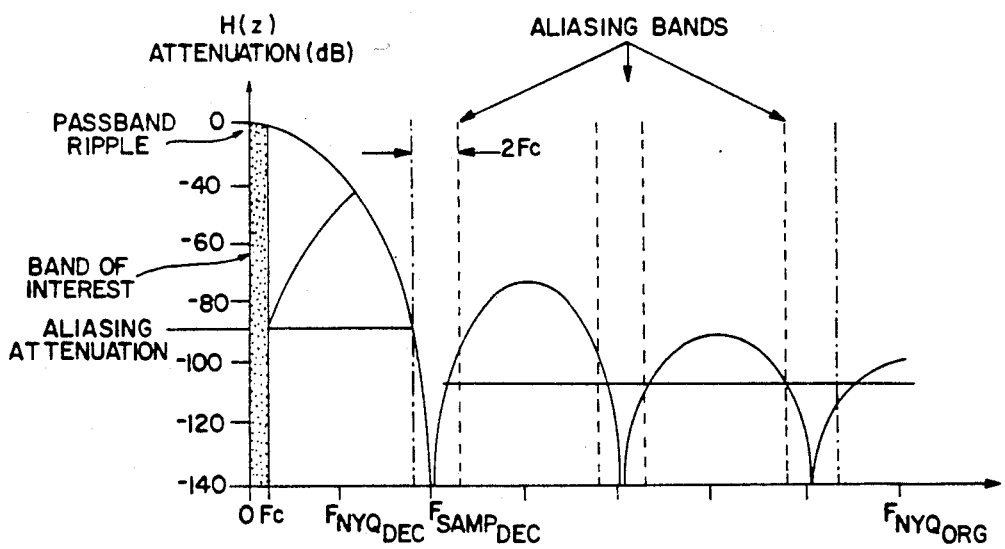
FIG. 6 depicts the frequency response of the high order decimation filter of FIG. 3.

A 26-bit input word is provided to the input comb filter stage section 30 from the decimation register 28. The comb filter stage section 30 has four comb filter stages 34a–d that are identical, and a fifth comb filter stage 34e that includes a rounder 27. An example of a comb filter stage 34 is shown in FIG. 5 and includes a register 42, an adder 46 and a NOR gate 4. In each of the comb filter stages 34a–e, the latched input from the register 42 is subtracted from the current input by the adder 46. This is done under the control of the NOR gate 44 in response to a control signal.

The adder bit widths are large due to the magnitude of the accumulation of the input into the integrator stages 32a–e. Data growth in the integrator stages 32a–e is subtracted off in the comb stages 34a–e, as can be seen in FIG. 3. The growth has a maximum of RN (i.e. N $\log_2 R$ bits) where R is the decimation factor and N is the number of stages. When a non-power of two decimation factor is used, a gain in the HDF filter 20 will result which can be removed in the FIR filter 24 by scaling the coefficients by the inverse of the gain.

The output of the HDF 20 is the nineteen most significant bits of the comb filter section 30, which is then rounded off to sixteen bits by a rounder 27. The rounder 27 is shown in more detail in FIG. 7.

The rounder 27 includes logic circuitry 48 that receives nineteen bits b[18:0]. The output of this rounding logic circuit 48 is provided as an input y(0) to an adder 50. This input y(0) is a rounding bit. The adder 50 of the comb filter stage 32e receives bits b(18:3) of the nineteen bits from the fourth comb filter stage 34d. Using the rounding bit, the adder 50 provides a sixteen bit output z[15:0], which forms the output of the HDF 20. This output of the rounder 27 (and the HDF 20) forms the input to the FIR filter 24. A more detailed explanation of the method of rounding carried out by the rounding logic circuit 48 now follows.

The output of the last comb filter stage 34e in the HDF 20 has a binary, two's complement format defined as follows for clarity of explanation:

$$-b[18]x2^{15} + b[17]x2^{14} + b[16]x2^{13} + b[15]x2^{12} +$$
$$b[14]x2^{11} + b[13]x2^{10} + b[12]x2^9 + b[11]x2^8 + b[10]x2^7 +$$
$$b[9]x2^6 + b[8]x2^5 + b[7]x2^4 + b[6]x2^3 + b[5]x2^2 +$$
$$b[4]x2^1 + b[3]x2^0 + b[2]x2^{-1} + b[1]x2^{-2} + b[0]x2^{-3}$$

This rounding methodology meets the three criteria established for successful rounding. These criteria are: 1) Rounding to sixteen bits of accuracy (using the definition given above rounding is to the nearest integer value); 2) Symmetric rounding to prevent the synthesis of a 0 Hz spectral component by the rounding process and thus a reduction in spurious free dynamic range; and 3) the prevention of roll over from a high positive value to the most negative value during the rounding process.

The rounder 27 implements the following rounding algorithm.

If b[18]=0 and b[2]=1 and b[17] through b[3] are not all =1
(positive values with a fractional part greater than or equal to 0.5 and the integer part is not the greatest possible positive value)
Then truncate to the top 16 bits (b[18] through b[3]) and add 1 to the binary value Else if b [18]=0 and b[2]=1 and b[17] through b[3] are all =1
(positive values with a fractional part greater than or equal to 0.5 and the integer part is the greatest possible positive value—rounding will cause roll over)
Then
    truncate to the top 16 bits b[18] through b[3])

Else if b [18]=0 and b[2]=0
(positive values with a fractional part less than 0.5)
Then
    truncate to the top 16 bits (b[18] through b[3])
Else if b[18]=1 and b[2],b[1],b[0]=101, 110, or 111
(negative values with fractional part of magnitude values less than 0.5)
Then
    truncate to the top 16 bits (b[18] through b[3]) and add 1 to the binary value, ignore all possible carry or sign roll over Else if b[18]=1 and b[2],b[1],b[0]=000,001,010,011, or 100
(negative values with fractional part of magnitude values greater than or equal to 0.5 or equal to 0)
Then
    truncate to the top 16 bits (b[18] through b[3]

Figure 7:
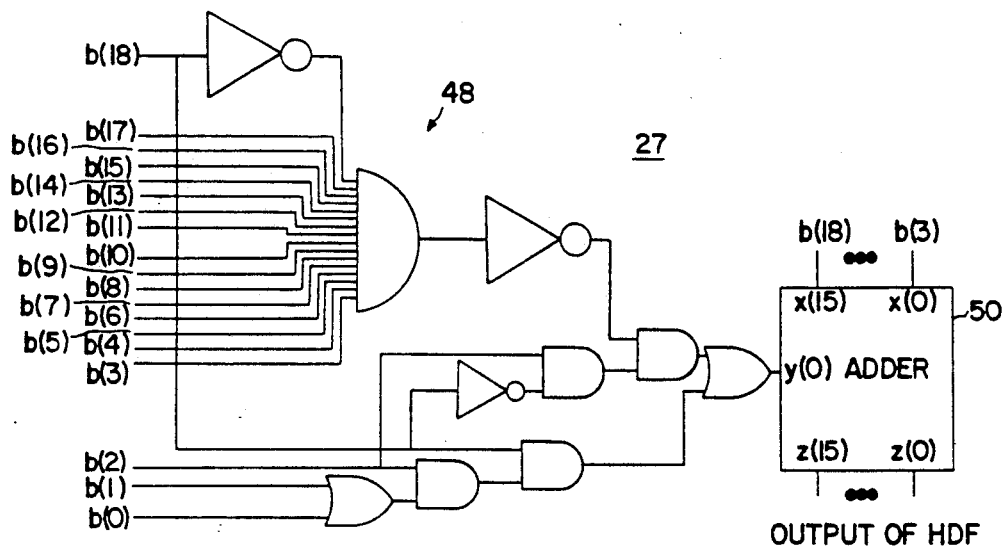
FIG. 7 shows a rounder used with the output of the last comb filter stage in the embodiment of the high order decimation filter of FIG. 3.

This algorithm is shown schematically in the logic circuit 48 in FIG. 7.

The output of the rounder 27 is then fed into the FIR filter 24.

A feature of the present invention is the ability to bypass the HDF 20 entirely, or one or more of the individual stages 32a-e and 34a-e. Thus, the digital decimation filter 16 can be used as an FIR filter, as well as having the HDF 20 tailored to produce an appropriate frequency response for the digital decimation filter 16. The bypassing is performed under the control of the control signals, in response to the parameters stored by the user in a register, now shown.

Figure 8:
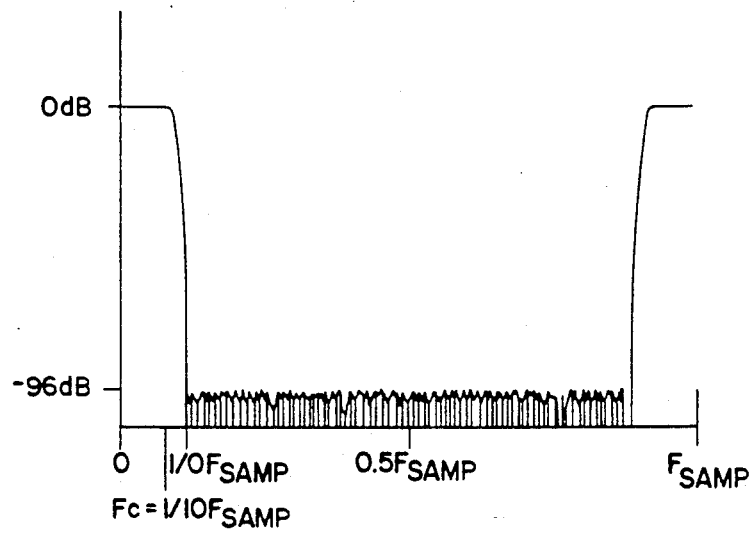
FIG. 8 depicts a typical FIR filter response.

An example of a frequency response for an FIR filter 24 is shown in FIG. 8. The FIR filter 24 performs the final shaping of the signal spectrum and suppresses the aliasing components outside the band of interest. The FIR filter 24 is implemented with a single multiplier/accumulator structure and RAM for storage of the data and filter coefficients. The FIR filter 24 can implement up to 512 symmetric taps and further decimates by a factor up to 16.

Figure 9:
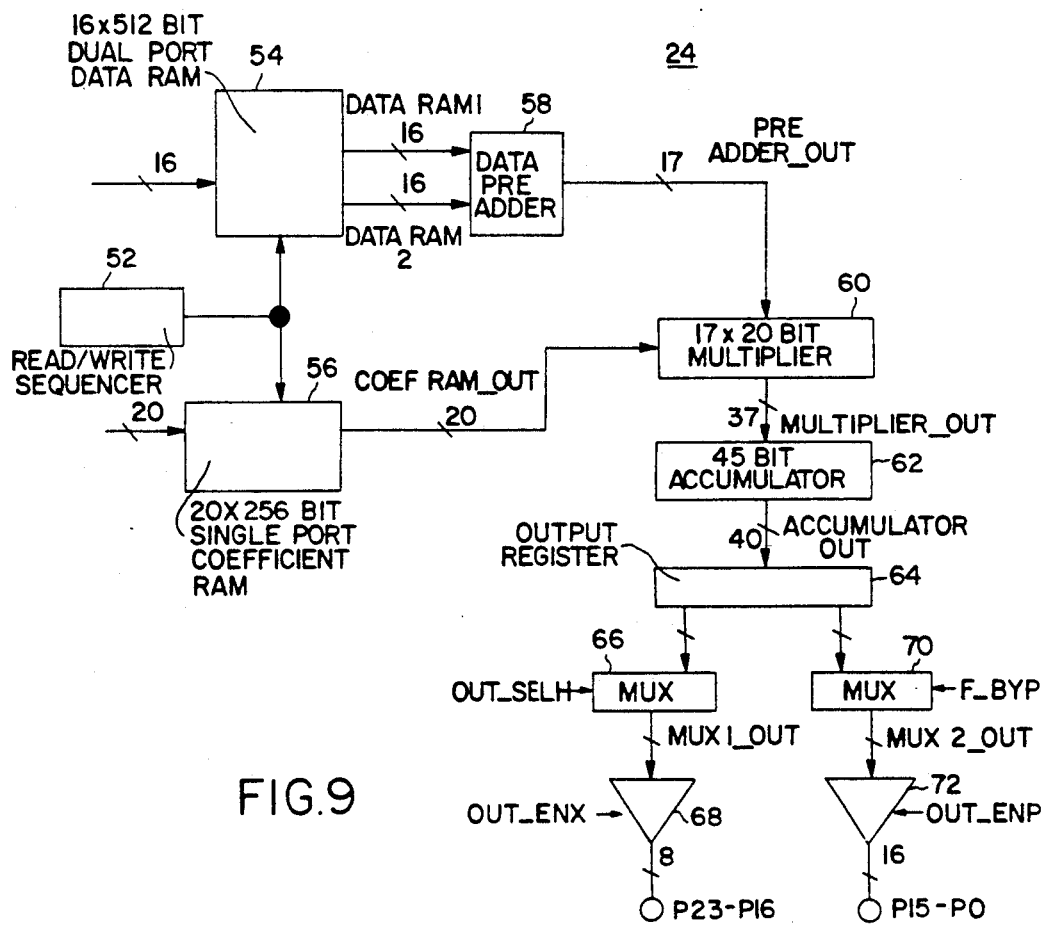
FIG. 9 is a block diagram of an FIR filter constructed in accordance with an embodiment of the present invention that is used with the embodiment of the digital decimation filter of FIG. 2.

A block diagram of an embodiment of the FIR filter 24 is illustrated in FIG. 9. It includes a read/write sequencer 52 coupled to a data RAM 54 that is 16×512 bits, and a coefficient RAM 56 that is 20×256 bits. Due to the symmetrical nature of the filters, the coefficient RAM 56 is half as deep as the data RAM 54. The number of coefficients that need to be stored for even and odd filters are (# of taps)/2 and (# of taps+1)/2 respectively.

The data RAM 54 is coupled to a data preadder 58 which is coupled to a 17×20 bit multiplier 60. The coefficient RAM 56 is also coupled to this multiplier 60. The output of the multiplier 60 is provided as an input to a 45 bit accumulator 62. The 40 bit output of the accumulator 62 is provided as an input to an output register 64. Eight bits [23:16] of the output of the FIR filter 24 is provided through a multiplexer 66 and output driver. Sixteen bits, bits [15:0], are provided from the output register 64 through a multiplexer 70 and an output driver.

Figure 10:
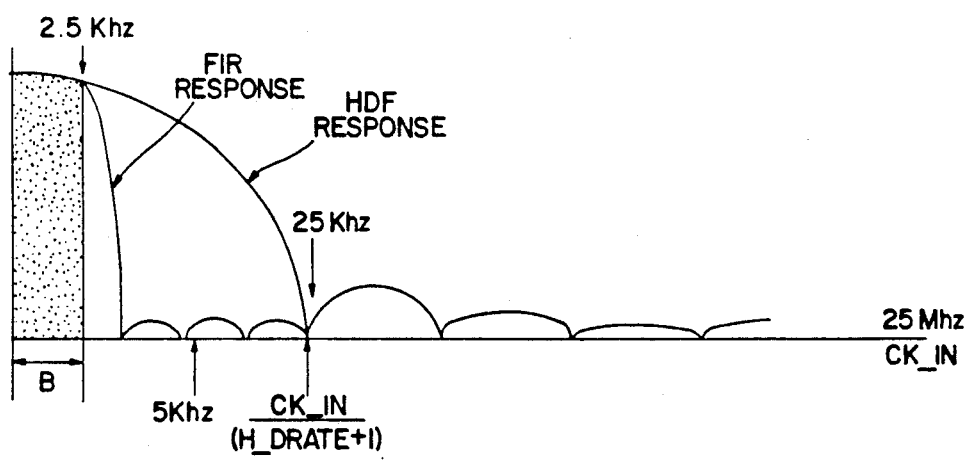
FIG. 10 illustrates an example of system requirements and the filter responses of the digital decimation filter of FIG. 2.

FIG. 10 illustrates the filter responses of the HDF 20 and the FIR filter 24 for an exemplary set of system requirements. Assume that the input sample rate (CKIN) is 25 MHz and the single-sided signal bandwidth is 2.5 KHz. In this example, 96dB of rejection is required.

For 96dB of aliasing rejection, the HDF 20 requires the ratio of the single bandwidth B to the HDF 20 output sampling rate Fs the 1/10, or in other words (B/Fs=1/10).

Since Fs is the ratio of the input sampling rate CKIN to the HDF decimation factor HDRATE+1, then: Fs=(CKIN/HDRATE+1). The HDF decimation factor HDRATE+1 must be 1,000 in order to achieve this ratio. In this example, CKIN=25 MHz; B=2.5 KHz; Fs=CKIN/HDRATE+1; HDRATE+1=1,000 and B/Fs=2.5 KHz/25 KHz=1/10. If the Nyquist rate is the desired output sample rate for the signal in the FIR filter 24, a decimation factor of 5 will be required. The response of the HDF 20 and the response of the FIR filter 24, with these parameters, is shown in FIG. 10.

The value of the decimation provided by the HDF 20 is produced by using only adders and delay elements (see, for example, FIGS. 4 and 5). If a standard FIR filter was used for such a high sampling rate, e.g. 25 MHz) then an extremely large number of multipliers and accumulators would be required. The use of only adders and delay elements to provide a large reduction in the sampling rate translates into a large hardware savings. Furthermore, the use of a single multiplier/accumulator in the FIR filter 24 further increases the amount of savings in hardware. The combination of using an FIR filter 24 that has a single multiplier/accumulator with the savings in hardware in the HDF filter 20, which uses only adders and delays, allows the entire digital decimation filter to be implemented on a single integrated circuit.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. A digital decimation filter comprising:
    a high order decimation filter having an input and an output, the high order decimation filter receiving input digital data at P sampling rate at its input, decimating the input digital data by a decimation factor R where R is greater than 100, and producing decimated output digital data at Q sampling rate at its output, where P>Q; and
    a finite impulse response (FIR) filter having an input and an output, with the input of the FIR filter coupled to the output of the high order decimation filter, the FIR filter performing further decimation and final shaping of the decimated output digital data to produce narrow band filtered digital data at the output of the FIR filter.

2. The digital decimation filter of claim 1, wherein the high order decimation filter and the FIR filter are provided on a single integrated circuit.

3. The digital decimation filter of claim 2, wherein the FIR filter contains only a single multiplier and a single accumulator, an input of the multiplier being coupled to the input of the FIR filter and an input of the accumulator being coupled to an output of the multiplier.

4. The digital decimation filter of claim 3, wherein the high order decimation filter is a Hogenauer filter.

5. The digital decimation filter of claim 4, wherein the Hogenauer filter includes a cascaded integrator filter stage section having an input and an output and a comb filter stage section having an input coupled to the output of the integrator filter stage section.

6. The digital decimation filter of claim 5, wherein the Hogenauer filter further includes a decimation register coupled between the cascaded integrator filter stage section and the comb filter stage section.

7. The digital decimation filter of claim 6, wherein the cascaded integrator filter stage section of the Hogenauer filter includes a plurality of identical integrator filter stages.

8. A digital decimation filter comprising:
- a high order decimation filter having an input and an output, the high order decimation filter receiving input digital data at P sampling rate at its input, decimating the input digital data by a decimation factor R where R is greater than 100, and producing decimated output digital data at Q sampling rate at its output, where $P>Q$;
- a finite impulse response (FIR) filter having an input and an output, with the input of the FIR filter coupled to the output of the high order decimation filter, the FIR filter performing further decimation and final shaping of the decimated output digital data to produce narrow band filtered digital data at the output of the FIR filter;
- wherein the high order decimation filter and the FIR filter are provided on a single integrated circuit;
- wherein the FIR filter contains only a single multiplier and a single accumulator, an input of the multiplier being coupled to the input of the FIR filter and an input of the accumulator being coupled to an output of the multiplier;
- wherein the high order decimation filter is a Hogenauer filter;
- wherein the Hogenauer filter includes a cascaded integrator filter stage section and a comb filter stage section coupled to the integrator filter stage section;
- wherein the Hogenauer filter further includes a decimation register coupled between the cascaded integrator filter stage section and the comb filter stage section;
- wherein the cascaded integrator filter stage section of the Hogenauer filter includes a plurality of identical integrator filter stages; and
- wherein the comb filter stage section includes a plurality of comb filter stages and at least one of the comb filter stages includes a rounder, an output of the rounder being the output of said high order decimation filter, said rounder rounding the decimated output digital data before the decimated output digital data is provided as an input to the FIR filter.

9. A digital decimation filter comprising:
- a high order decimation filter having an input and an output, the high order decimation filter receiving input digital data at P sampling rate at its input, decimating the input digital data by a decimation factor R where R is greater than 100, and producing decimated output digital data at Q sampling rate at its output, where $P>Q$;
- a finite impulse response (FIR) filter having an input and an output, with the input of the FIR filter coupled to the output of the high order decimation filter, the FIR filter performing further decimation and final shaping of the decimated output digital data to produce narrow band filtered digital data at the output of the FIR filter;
- wherein the high order decimation filter and the fir filter are provided on a single integrated circuit;
- wherein the FIR filter contains only a single multiplier and a single accumulator, an input of the multiplier being coupled to the input of the FIR filter and an input of the accumulator being coupled to an output of the multiplier;
- wherein the high order decimation filter is a Hogenauer filter;
- wherein the Hogenauer filter includes a cascaded integrator filter stage section and a comb filter stage section coupled to the integrator filter stage section;
- wherein the Hogenauer filter further includes a decimation register coupled between the cascaded integrator filter stage section and the comb filter stage section;
- wherein the cascaded integrator filter stage section of the Hogenauer filter includes a plurality of identical integrator filter stages; and
- wherein the comb filter stage section includes a plurality of comb filter stages, and further comprising means coupled to the Hogenauer filter for programmably bypassing at least one of the integrator filter stages and at least one of the comb filter stages.

10. A digital decimation filter comprising:
- a high order decimation filter having an input and an output, the high order decimation filter receiving input digital data at P sampling rate at its input, decimating the input digital data by a decimation factor R where R is greater than 100, and producing decimated output digital data at Q sampling rate at its output, where $P>Q$;
- a finite impulse response (FIR) filter having an input and an output, with the input of the FIR filter coupled to the output of the high order decimation filter, the FIR filter performing further decimation and final shaping of the decimated output digital data to produce narrow band filtered digital data at the output of the FIR filter; and
- further comprising a data shifter having an input for receiving input digital data and an output coupled to the input of the high order decimation filter, said data shifter shifting input digital data to provide growth bits for the input digital data and producing the shifted input digital data at its output.

11. The digital decimation filter of claim 10, further comprising means coupled to the data shifter for controllably varying the number of growth bits provided for the input digital data.

12. A digital decimation filter comprising:
- a high order decimation filter having an input and an output, the high order decimation filter receiving input digital data at P sampling rate at its input, decimating the input digital data by a decimation factor R where R is greater than 100, and producing decimated output digital data at Q sampling rate at its output, where $P>Q$;

a finite impulse response (FIR) filter having an input and an output, with the input of the FIR filter coupled to the output of the high order decimation filter, the FIR filter performing further decimation and final shaping of the decimated output digital data to produce narrow band filtered digital data at the output of the FIR filter; and further comprising means coupled to the high order decimation filter and the FIR filter for programmably bypassing the high order decimation filter or the FIR filter.

13. A narrow band digital filter comprising:

a Hogenauer filter having an input and an output, the Hogenauer filter receiving input digital data at P sampling rate at its input, decimating the input digital data by a decimation factor R, where R is greater than 100 and producing decimated output digital data at Q sampling rate at its output, where $P>Q$;

a finite impulse response (FIR) filter having an input and an output, with the input of the FIR filter coupled to the output of the Hogenauer filter, the FIR filter performing final shaping of the decimated output digital data to produce narrow band filtered digital data at the output of the FIR filter;

wherein the FIR filter contains only one multiplier and only on accumulator, and the narrow band filter is provided on a single integrated circuit.

14. The narrow band digital filter of claim 13, wherein the FIR filter includes means for decimating.

* * * * *